(12) United States Patent
Kang et al.

(10) Patent No.: US 10,382,061 B2
(45) Date of Patent: *Aug. 13, 2019

(54) CONVOLUTIONAL DECODER AND METHOD OF DECODING CONVOLUTIONAL CODES

(71) Applicant: Samsung Electronics Co., Ltd., Suwon-si (KR)

(72) Inventors: Hyungu Kang, Suwon-si (KR); Yoochang Eun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/057,719

(22) Filed: Aug. 7, 2018

(65) Prior Publication Data

US 2018/0351580 A1    Dec. 6, 2018

Related U.S. Application Data

(63) Continuation of application No. 15/340,992, filed on Nov. 2, 2016, now Pat. No. 10,069,517.

(30) Foreign Application Priority Data

Jul. 6, 2016  (KR) .................. 10-2016-0085666
Jul. 22, 2016 (KR) .................. 10-2016-0093103

(51) Int. Cl.
  *H03M 13/23* (2006.01)
  *H04L 1/00* (2006.01)
  *H03M 13/41* (2006.01)

(52) U.S. Cl.
  CPC ......... *H03M 13/23* (2013.01); *H03M 13/413* (2013.01); *H03M 13/4107* (2013.01);
  (Continued)

(58) Field of Classification Search
  CPC ............ H03M 13/23; H03M 13/4107; H03M 13/413; H03M 13/4169; H04L 1/0045; H04L 1/0059
  See application file for complete search history.

(56) References Cited

U.S. PATENT DOCUMENTS 6,259,749 B1    7/2001   Andoh
6,324,226 B1 *  11/2001  Sasagawa ......... H03M 13/4107
                                                  375/341
(Continued)

FOREIGN PATENT DOCUMENTS

JP    2003-258650    9/2003
JP    2005-294898    10/2005
(Continued)

OTHER PUBLICATIONS

Notice of Allowance dated May 18, 2018, in U.S. Appl. No. 15/340,992.
(Continued)

*Primary Examiner* — Kyle Vallecillo
(74) *Attorney, Agent, or Firm* — H.C. Park & Associates, PLC

(57) ABSTRACT

A convolutional decoder includes a first storage, a second storage, a branch metric processor to determine branch metrics for transitions of states from a start step to a last step according to input bit streams, an ACS processor to select maximum likelihood path metrics to determine a survival path according to the branch metrics and to update states of the start step to the first storage and the second storage alternately based on the selection of the maximum likelihood path metrics, and a trace back logic to selectively trace back the survival path based on the states of the start step stored in a selected storage among the first storage and the second storage.

20 Claims, 9 Drawing Sheets

(52) U.S. Cl.
CPC ...... *H03M 13/4169* (2013.01); *H04L 1/0045* (2013.01); *H04L 1/0059* (2013.01)

(56) References Cited

U.S. PATENT DOCUMENTS

| | | |
|---|---|---|
| 6,651,215 B2 | 11/2003 | Miyauchi et al. |
| 6,842,490 B1 | 1/2005 | Qian |
| 7,571,376 B2 | 8/2009 | Cho et al. |
| 7,962,841 B2 | 6/2011 | Rho et al. |
| 8,230,308 B2 | 7/2012 | Takanashi |
| 8,843,811 B2 | 9/2014 | Jang et al. |
| 9,209,837 B1 | 12/2015 | Cheong et al. |
| 9,419,656 B2 | 8/2016 | Kuo |
| 2004/0122883 A1* | 6/2004 | Lee .................. G06F 7/22 708/490 |
| 2006/0115023 A1 | 6/2006 | Ovadia et al. |
| 2007/0104296 A1 | 5/2007 | Miyauchi et al. |
| 2009/0172503 A1* | 7/2009 | Takanashi ......... H03M 13/3753 714/792 |

FOREIGN PATENT DOCUMENTS

| | | |
|---|---|---|
| JP | 4047697 | 2/2008 |
| JP | 2011-239107 | 11/2011 |
| KR | 10-2007-0074213 | 7/2007 |
| KR | 10-2013-0073333 | 7/2013 |

OTHER PUBLICATIONS

Final Office Action dated Mar. 12, 2018, in U.S. Appl. No. 15/340,992.
Non-Final Office Action dated Sep. 27, 2017, in U.S. Appl. No. 15/340,992.

* cited by examiner

CONVOLUTIONAL DECODER AND METHOD OF DECODING CONVOLUTIONAL CODES

CROSS-REFERENCE TO RELATED APPLICATIONS

This application is a continuation of U.S. patent application Ser. No. 15/340,992, filed Nov. 2, 2016, and claims priority from and the benefit of Korean Patent Application No. 10-2016-0085666, filed Jul. 6, 2016, and Korean Patent Application No. 10-2016-0093103, filed Jul. 22, 2016, each of which is hereby incorporated by reference for all purposes as if fully set forth herein.

BACKGROUND

Field

Exemplary embodiments relate to electronic devices and methods, and, more particularly, to a convolutional decoder and a method of decoding convolutional codes.

Discussion of the Background

In a radio communication system, each communication terminal communicates data via networks. Generally, communication errors may occur when data is transmitted from a transmitting terminal to a receiving terminal, and error correction coding is employed for enabling the correction of the communication errors. Data reliability can be improved by encoding data to be transmitted at the transmitting terminal and decoding the encoded data at the receiving terminal. For example the error correction coding may include block coding and convolutional coding.

A Long Term Evolution (LTE) system uses Physical Downlink Control Channel (PDCCH) as a format of downlink control channel. The downlink refers to a radio communication from a base station to a user equipment (UE) supporting a mobile communication, e.g., LTE standards technologies. The PDCCH includes Downlink Control Information (DCI). In an LTE system, DCIs are encoded by Tail Biting Convolutional Code (TBCC).

The UE may use a Viterbi decoding algorithm to decode the received PDCCH. The Viterbi decoding algorithm typically includes more than one training operations followed by a maximum likelihood path finding and a trace back operation to determine decoded bit streams.

The above information disclosed in this Background section is only for enhancement of understanding of the background of the inventive concept, and, therefore, it may contain information that does not form the prior art that is already known to a person of ordinary skill in the art.

SUMMARY

Exemplary embodiments provide a convolutional decoder and a method of decoding convolutional codes having high reliability and improved operation speed.

Additional aspects will be set forth in the detailed description which follows, and, in part, will be apparent from the disclosure, or may be learned by practice of the inventive concept.

According to an exemplary embodiment, a convolutional decoder includes a first storage, a second storage, a branch metric processor to determine branch metrics for transitions of states from a start step to a last step according to input bit streams, an Add-Compare-Select (ACS) processor to select maximum likelihood path metrics to determine a survival path according to the branch metrics, and to update states of the start step to the first storage and the second storage alternately based on the selection of the maximum likelihood path metrics, and a trace back logic to selectively trace back the survival path based on the states of the start step stored in a selected storage among the first storage and the second storage.

According to an exemplary embodiment, a convolutional decoder includes a path metric memory to store first path metrics corresponding to states of a start step, a Add-Compare-Select (ACS) processor, based on first branch metrics and the first path metrics, to select second path metrics corresponding to states of a second step, a first storage, and a second storage. The ACS processor is configured to read start states respectively corresponding to the states of the start step from the first storage and update the read start states to the second storage in response to the second path metrics being selected.

According to an exemplary embodiment, a method of decoding convolutional codes includes receiving input bit streams, determining a survival path by selecting maximum likelihood path metrics for transitions of states from a start step to a last step based on the input bit streams, and selecting whether to perform a trace back for the survival path. Determining the survival path includes updating states of the start step to a first storage and a second storage alternately based on selecting the maximum likelihood path metrics.

According to an exemplary embodiment, a computing apparatus includes a convolutional decoder including a first storage and a second storage. The convolutional decoder is configured to determine, according to input bit streams, branch metrics for transitions of states from a start step to a last step, select maximum likelihood path metrics to determine a survival path according to the branch metrics, update states of the start step to the first storage and the second storage alternately based on the selection of the maximum likelihood path metrics, and selectively trace back the survival path based on the states of the start step stored in a selected storage among the first storage and the second storage.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
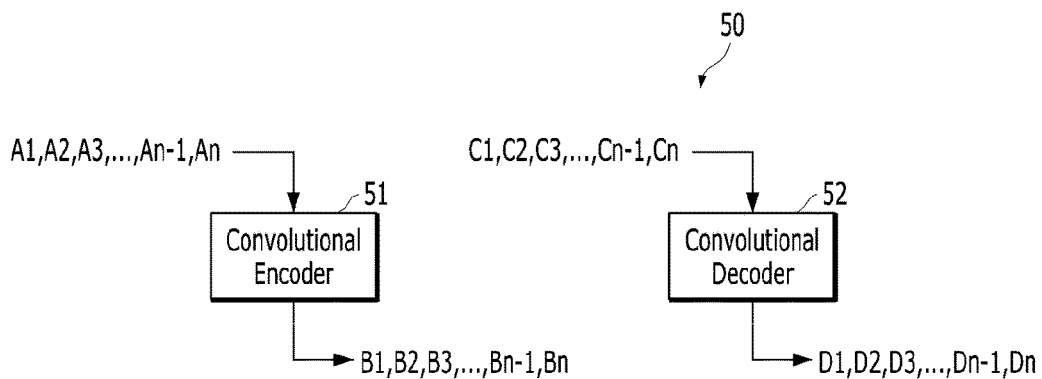
FIG. 1 is a block diagram illustrating a system including a convolutional encoder and a convolutional decoder.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a system including a convolutional encoder and a convolutional decoder.

Referring to FIG. 1, the convolutional encoder 51 receives bit streams A1, A2, A3, . . . , An-1, and An and outputs encoded bit streams B1, B2, B3, . . . , Bn-1, and Bn (n is a positive integer). The convolutional encoder 51 may include a shift register being able to store k bits (k is a positive integer). As inputting the bit streams A1 through An to the shift register in a unit of i bits, the convolutional encoder 51 may output the encoded bit streams B1 through Bn by calculating the i bits and the k bits stored in the shift register with convolutional codes (i is a positive integer less than k). In this case, a constraint length is i+k, and a code rate is calculated by dividing the number of elements of B1 by the number of elements of A1 (1 is a positive integer less than or equal to n).

The convolutional encoder 51 may encode the bit streams A1 through An according to tail biting convolutional code. For example, initial values of k bits in the shift register may be set by the last k bits of the bit streams A1 through An.

An operation of inputting the i bits to the shift register may be defined as a stage. The bit streams A1 through An may be inputted to the shift register through a plurality of stages. For instance, the bit streams A1 through An may be inputted to the shift register through n stages when the i bits are the same as the number of elements of A1.

The encoded bit streams B1 through Bn are modulated and transmitted to a receiver including the convolutional decoder 52, and the corresponding bit streams C1 through Cn are recovered and input to the convolutional decoder 52 as input bit streams C1, C2, C3, . . . , Cn-1, and Cn. Ideally the encoded bit streams B1 through Bn are the same as the input bit streams C1 through Cm, but in reality there are generally transmission errors. The convolutional decoder 52 decodes the input bit streams C1 through Cn to output decoded bit streams D1, D2, D3, . . . , Dn-1, and Dn. The decoding operation may be performed according to Viterbi algorithm.

Figure 2:
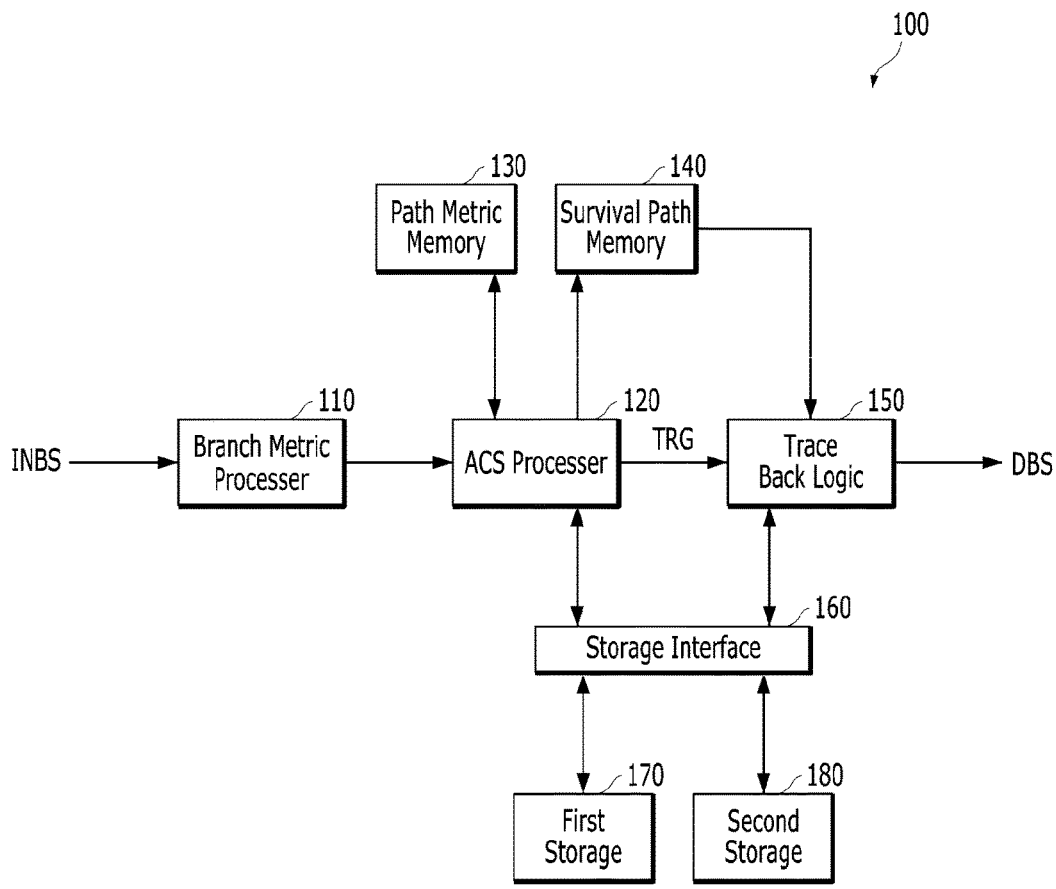
FIG. 2 is a block diagram illustrating a convolutional decoder according to an exemplary embodiment.
Figure 3:
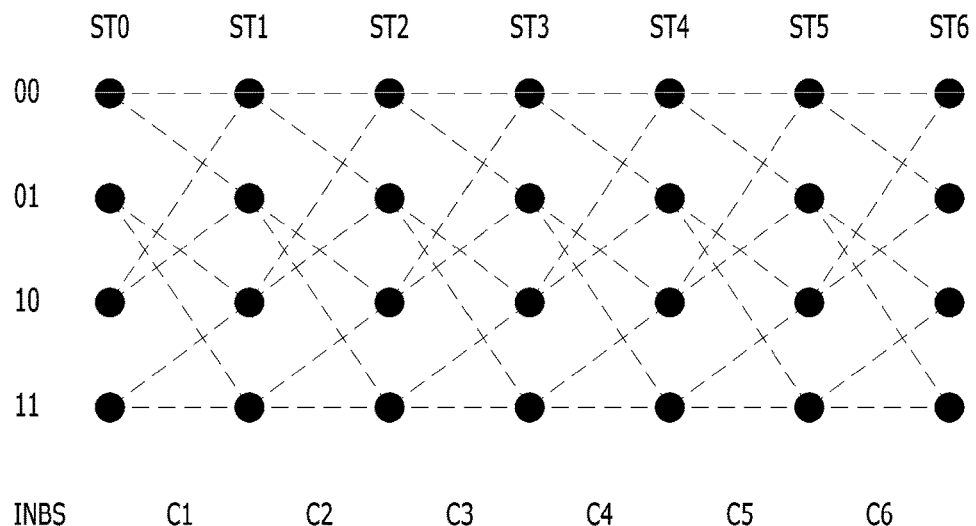
FIG. 3 illustrates an example of transitions of a plurality of states from a start step to a last step in trellis representation.
Figure 4:
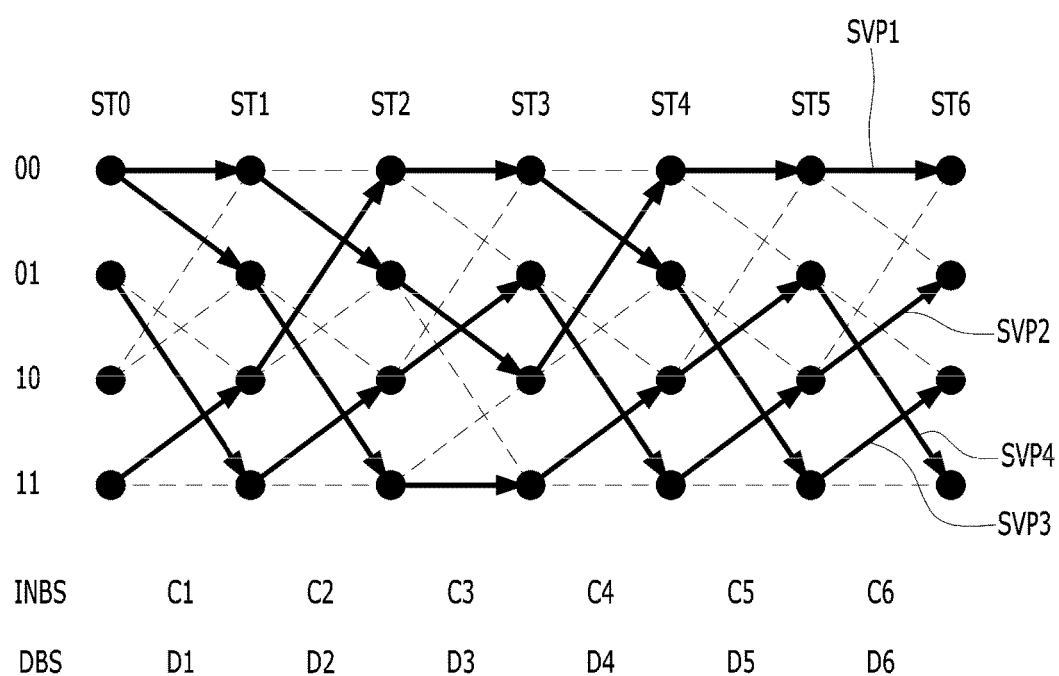
FIG. 4 illustrates an example of survival paths in trellis representation.

FIG. 2 is a block diagram illustrating a convolutional decoder according to an exemplary embodiment. FIG. 3 illustrates an example of transitions of a plurality of states from a start step to a last step in trellis representation. FIG. 4 illustrates an example of survival paths in trellis representation.

Referring to FIG. 2, the convolutional decoder 100 includes a branch metric processor 110, an Add-Compare-Select (ACS) processor 120, a path metric memory 130, a survival path memory 140, a trace back logic 150, a storage interface 160, a first storage 170, and a second storage 180.

The branch metric processor 110 receives input bit streams INBS. The input bit streams INBS may correspond to the input bit streams C1 through Cn shown in FIG. 1. The branch metric processor 110 calculates branch metrics for transitions of states from a start step to a last step in trellis representation. The branch metric processor 110 may determine the branch metrics by calculating the input bit streams INBS with hypothesized codes which correspond to convolutional codes of the convolutional encoder 51 shown in FIG. 1.

The branch metric processor 110 may calculate the branch metrics in hard-decision manner or soft-decision manner. A hard-decision branch metric processor may use as a metric known as a Hamming distance for each of the transitions between the steps. For example, the branch metric processor 110 may calculate the Hamming distance by comparing an input bit stream and a corresponding hypothesized code bit-by-bit and determining a number of bits having different values. A soft-decision branch metric processor may receive the input bit streams INBS including information about the reliability of each of received bits, and calculate information representing a strong match or a weak match between an input bit stream and a corresponding hypothesized code to determine the branch metrics.

The transitions between the states in the trellis representation are shown in FIG. 3. Each of the transitions are marked with dotted lines. For descriptive convenience, it is assumed that the convolutional encoder 51 shown in FIG. 1 uses a shift register storing 2 bits, inputs bit streams A1 through An in FIG. 1 to the shift register in a unit of a bit, and inputs the bit streams A1 through An to the shift register through 6 stages. It means that the trellis representation having 4 possible states 00, 01, 10, and 11 and having 6 steps ST1 through ST6 can be considered and each of output bit streams D1 through D6 includes a single bit. However, embodiments are not limited thereto; the number of bits stored in the shift register of the convolutional encoder 51 and the number of bits inputted to the shift register may be modified, therefore the trellis representation may have a different number of states and a different number of steps.

Since the bit streams A1 through An are inputted to the shift register of the convolutional encoder 51 in a unit of a bit, it can be estimated that a certain state of a current step may be transited from one of 2 states of a previous step in the trellis representation. For example, at an r-th step STr, each of a first state 00 and a second state 01 may be transited from one of the first state 00 and a third state 10 of an (r−1)-th step STr−1 where r is a positive integer less than or equal to 6. Each of the third state 10 and a fourth state 11 may be transited from one of the second state 01 and the fourth state 11.

The branch metric processor 110 shown in FIG. 2 calculates branch metrics for the transitions between states from a start step ST0 to a last step ST6. Input bit streams INBS may be divided into first through sixth input bit streams C1 through C6. The branch metric processor 110 may calculate a branch metric for each transition between the (r−1)-th step STr−1 and the r-th step STr according to an r-th input bit stream Cr. Each transition may correspond to a certain hypothesized code which is associated with a convolutional code used in the convolutional encoder 51. The branch metric processor 110 may calculate the r-th input bit stream Cr with a hypothesized code to determine a branch metric for a corresponding transition between the (r−1)-th step STr−1 and the r-th step STr.

In an exemplary embodiment, at least a portion of an operation time for calculating branch metrics may overlap an operation time for selecting maximum likelihood path metrics.

Referring back to FIG. 2, the ACS processor 120 receives branch metrics from the branch metric processor 110. The ACS processor 120 selects maximum likelihood path metrics for transitions from the start step to the last step according to the branch metrics and stores the selected path metrics to the survival path memory 140.

In an exemplary embodiment, the ACS processor 120 may summarize branch metrics of transitions between steps which increase sequentially to select maximum likelihood path metrics so as to determine a survival path.

At each step, the ACS processor 120 may select maximum likelihood path metrics respectively corresponding to states, and then store the selected path metrics to the path metric memory 130. The ACS processor 120 may read a maximum likelihood path metric selected at a previous step from the path metric memory 130, add each of branch metrics corresponding to a state of a current step to the read maximum likelihood path metric, and select, for example, a lower value among the added values as a maximum likelihood path metric corresponding to the state of the current step. The ACS processor 120 may update the selected path metric to the path metric memory 130. The ACS processor 120 may update the selected path to the survival path memory 140.

For example, the ACS processor 120 updates the state corresponding to the selected path metric to the survival path memory 140. The ACS processor 120 may repeatedly perform these operations from the start step to the last step. The selected paths accumulated in the survival path memory 140 after the last step is completed may represent a survival path.

The ACS processor 120 may transfer a trigger signal TRG to the trace back logic 150 after the last step is completed.

Referring to FIG. 4, transitions emphasized with arrows represent survival paths selected by the ACS processor 120. The first state 00 of the last step ST6 has a survival path SVP1 of the first state 00, the first state 00, the third state 10, the second state 01, the first state 00, and the first state 00 when traced back from the ST5 to ST0. The second state 01 of the last step ST6 has a survival path SVP2 of the third state 10, the fourth state 11, the second state 01, the third state 10, the fourth state 11, and the second state 01 when traced back from the ST5 to ST0. The third state 10 of the last step ST6 has a survival path SVP3 of the fourth state 11, the second state 01, the first state 00, the first state 00, the third state 10, and the fourth state 11 when traced back from the ST5 to ST0. The fourth state 11 of the last step ST6 has a survival path SVP4 of the second state 01, the third state 10, the fourth state 11, the fourth state 11, the second state 01, and the first state 00 when traced back from the ST5 to ST0.

Referring back to FIG. 2, the trace back logic 150 is coupled to the survival path memory 140. The trace back logic 150 may output decoded bit streams DBS according to survival paths stored in the survival path memory 140 in response to the trigger signal TRG. For example, a bit corresponding to each transition may be predetermined and stored in an internal memory of the convolutional decoder 100. The trace back logic 150 may output bits, which correspond to transitions of states on each survival path, as the decoded bit streams DBS.

The storage interface 160 interfaces the ACS processor 120, the trace back logic 150, and the first and second storages 170 and 180.

Each of the first and second storages 170 and 180 includes storage areas which correspond to states of a step, respectively. It is noted that the first and second storages 170 and 180 may employ any suitable storage medium. For instance, each of the first and second storages 170 and 180 may employ at least one of a register, SRAM (Static RAM), DRAM (Dynamic RAM), SDRAM (Synchronous DRAM), PRAM (Phase-change RAM), MRAM (Magnetic RAM), RRAM (Resistive RAM), FRAM (Ferroelectric RAM), and the like.

According to an exemplary embodiment, the ACS processor 120 updates a state of the start step associated with a state of a step to the first and second storages 170 and 180 alternately whenever maximum likelihood path metrics of each step are selected. The ACS processor 120 may update states of the start step from the first storage 170 to the second storage 180 when maximum likelihood path metrics of a t-th step are selected, where t is a positive integer. The ACS processor 120 may update the states of the start step from the second storage 180 to the first storage 170 when maximum likelihood path metrics of a (t+1)-th step are selected. This will be described in more detail with reference to FIG. 9.

After the last step is completed, one of the first and second storages 170 and 180 may store the states of the start step corresponding to survival paths.

When the input bit streams INBS are data encoded according to tail biting convolutional code, the inequality between a state of the start step (hereinafter, "start state")

and a state of the last step (hereinafter "last state") represents decoded bit streams of a corresponding survival path including erroneous data. The equality between the start state and the last state represents decoded bit streams of a corresponding survival path having high reliability.

According to an exemplary embodiment, the trace back logic 150 may read the start states from one of the first and second storages 170 and 180, and trace a survival path back when a last state of the survival path is equal to a start state. The trace back logic 150 may select a survival path and perform a trace back for the selected survival path to output the decoded bit streams DBS when a last state of the survival path is equal to a start state. The trace back logic 150 may not perform the trace back for a survival path when a last state of the survival path is not equal to a start state. In this manner, a survival path having the high reliability is selected based on the start states stored in one of the first and second storages 170 and 180, the convolutional decoder 100 may output the decoded bit streams DBS having guaranteed reliability with improved operation speed.

In FIG. 4, a last state of the first survival path SVP1 is equal to a start state as the first state 00, and a last state of the second survival path SVP2 is equal to a start state as the second state 01. A last state of each of the third and fourth survival paths SVP3 and SVP4 is different from a start state, respectively. The trace back logic 150 may output the decoded bit streams DBS based on the first survival path SVP1, and output the decoded bit streams DBS based on the second survival path SVP2.

A number of steps in the trellis representation may be determined depending on a design manner of a convolutional encoder 51 shown in FIG. 1. In an exemplary embodiment, a number of steps in the trellis representation may be predetermined. It means that a storage storing the start states after completing the last step is predetermined. The trace back logic 150 may access the predetermined storage. In an exemplary embodiment, a number of steps in the trellis representation may be changed by setting the convolutional decoder 100. One of the first and second storages 170 and 180 may be selected according to the setting of the convolutional decoder 100, and the trace back logic 150 may access the selected storage.

In an exemplary embodiment, an error check for the decoded bit streams DBS may be further performed. For example, the validity of the decoded bit streams DBS may be determined according to Cyclic Redundancy Check (CRC).

In an exemplary embodiment, at least one training operation may be performed before the maximum likelihood path finding and the trace back. The operations for updating the start states to the first and second storages 170 and 180 may be omitted in the training operation.

In an exemplary embodiment, the branch metric processor 110, the ACS processor 120, and the trace back logic 150 may be embodied as a combination of at least one of hardware, firmware, and software. When at least one of the branch metric processor 110, the ACS processor 120, and the trace back logic 150 is embodied as software, the software may be uploaded in machines having a suitable architecture and it may be processed by the machines. For example, the machines may be embodied on a computer platform including hardware such as a processor, a random access memory (RAM), and an input/output interface.

Figure 5:
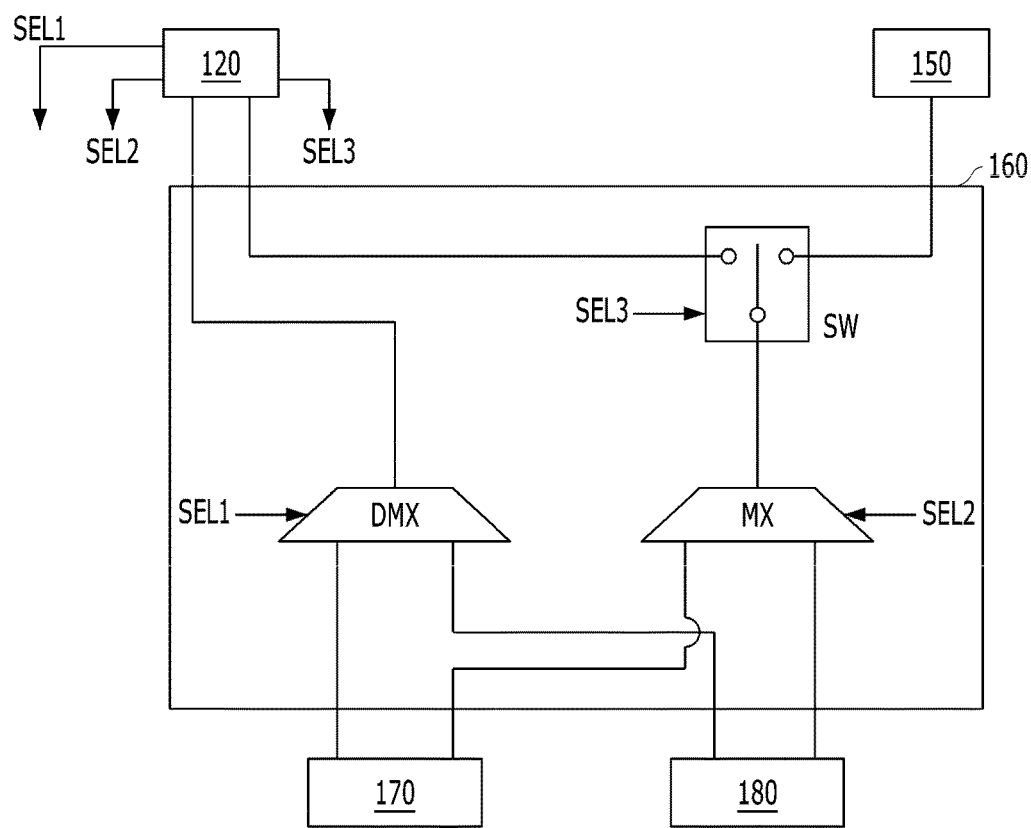
FIG. 5 is a block diagram illustrating the storage interface shown in FIG. 2.

FIG. 5 is a block diagram illustrating the storage interface shown in FIG. 2.

Referring to FIG. 5, the storage interface 160 includes a demultiplexer DMX, a multiplexer MX, and a switch SW.

The demultiplexer DMX operates under a first selection signal SEL1 provided from the ACS processor 120. An input terminal of the demultiplexer DMX is coupled to the ACS processor 120. Output terminals of the demultiplexer DMX are coupled to the first and second storages 170 and 180, respectively. The demultiplexer DMX may couple the ACS processor 120 to one of the first storage 170 and the second storage 180 in response to the first selection signal SEL1.

The multiplexer MX operates under a second selection signal SEL2 provided from the ACS processor 120. An output terminal of the multiplexer MX is coupled to one of the ACS processor 120 and the trace back logic 150 according to an operation of the switch SW. Input terminals of the multiplexer MX are coupled to the first and second storages 170 and 180, respectively.

The switch SW couples the output terminal of the multiplexer MX to one of the ACS processor 120 and the trace back logic 150 in response to a third selection signal SEL3 being provided from the ACS processor 120. The switch SW may couple the output terminal of the multiplexer MX to the ACS processor 120 until the last step is completed. The ACS processor 120 may output the third selection signal SEL3 to couple the output terminal of the multiplexer MX to the trace back logic 150 when the last step is completed.

The ACS processor 120 may read the start states from one of the first and second storages 170 and 180 through the multiplexer MX and update the read start states to the other storage through the demultiplexer DMX until the last step is completed.

When the last step is completed, the ACS processor 120 may select one of the first and second storages 170 and 180 by controlling the first and second selection signals SEL1 and SEL2. In an example, the ACS processor 120 selects one of the first and second storages 170 and 180 when transferring an enabled trigger signal TRG. In another example, one of the first and second storages 170 and 180 is selected in response to a selection signal from the trace back logic 150 when the trigger signal TRG is enabled. The trace back logic 150 may read the start states from the selected storage.

Figure 6:
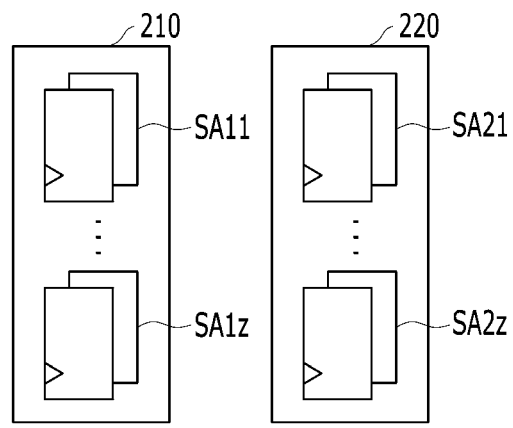
FIG. 6 is a block diagram illustrating an example of the first and second storages.

FIG. 6 is a block diagram illustrating an example of the first and second storages shown in FIG. 2.

Referring to FIG. 6, the first storage 210 and the second storage 220 may include storage areas SA11 through SA1z and storage areas SA21 through SA2z, respectively. The storage areas of the first storage 210 and the second storage 220 may be embodied as flip-flops.

The storage areas SA11 through SA1z may correspond to states of a step of the trellis representation, respectively. The storage areas SA21 through SA2z may also correspond to states of a step of the trellis representation, respectively. Each storage area may include at least one flip-flop for representing a state of the trellis representation.

For example, when the trellis representation includes the first through fourth states 00, 01, 10, and 11, a storage includes 4 storage areas respectively corresponding to the first through fourth states 00, 01, 10, and 11, and each storage area includes at least two flip-flops for representing each state.

Figure 7:
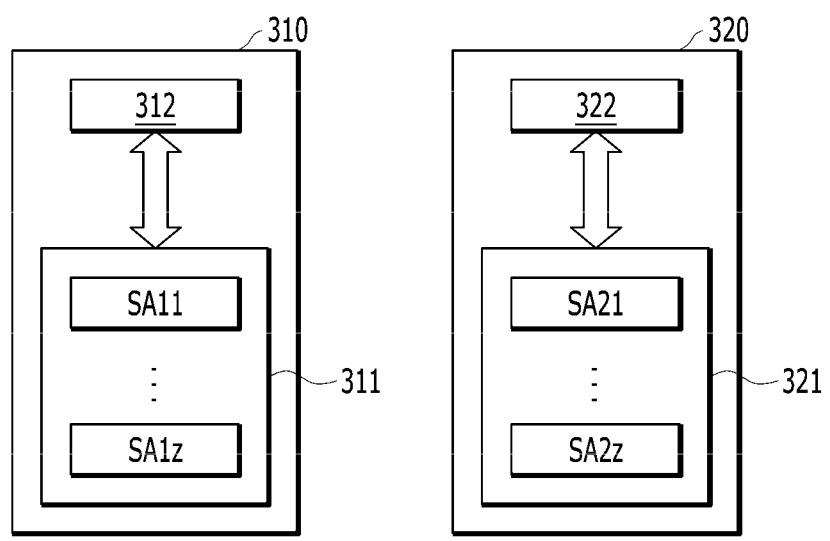
FIG. 7 is a block diagram illustrating another example of the first and second storages.

FIG. 7 is a block diagram illustrating another example of the first and second storages shown in FIG. 2.

Referring to FIG. 7, a first storage 310 and a second storage 320 may include a first memory bank 311 and a second memory bank 321, respectively. The first memory bank 311 includes storage areas SA11 through SA1z, and the first memory bank 311 may be controlled by a first read and write circuit 312. The second memory bank 321 includes storage areas SA21 through SA2z, and the second memory bank 321 may be controlled by a second read and write circuit 322.

The storage areas SA11 through SA1z of a first storage 310 may correspond to states of a step of the trellis representation, respectively. The storage areas SA21 through SA2z of a second storage 320 may also correspond to the states of a step of the trellis representation, respectively. Each storage area may include at least one memory cell for representing a state of the trellis representation.

Unlike the example shown in FIG. 7, the first and second storages 310 and 320 may include a common read and write circuit which is able to access both of the first and second memory banks 311 and 321. In this case, the first and second memory banks 311 and 321 may be physical or logical blocks into which a memory array is divided.

Figure 8:
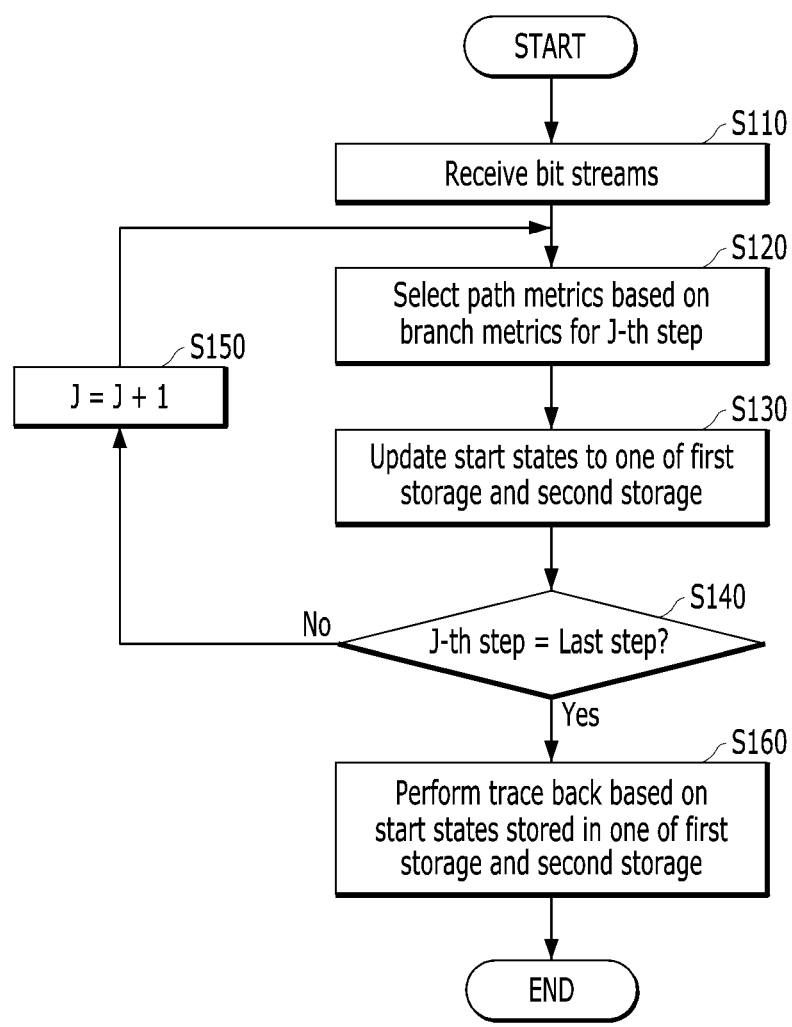
FIG. 8 is a flowchart illustrating a method of decoding convolutional codes according to an exemplary embodiment.

FIG. 8 is a flowchart illustrating a method of decoding convolutional codes according an exemplary embodiment.

Referring to FIGS. 2 and 8, in operation S110, input bit streams INBS are received. The input bit streams INBS may correspond to, for example, a code word.

In operation S120, maximum likelihood path metrics for a J-th step are selected based on branch metrics, where J is a positive integer. The convolutional decoder 100 may select the maximum likelihood path metrics for states of the J-th step.

In operation S130, start states associated with the states of the J-th step are updated to one of the first and second storages 170 and 180. The convolutional decoder 100 may read the start states from one of the first and second storages 170 and 180, and update the read start states to the other storage. This will be described in more detail with reference to FIG. 9.

In operation S140, the operation S150 is performed when the J-th step is not a last step. The operation S160 is performed when the J-th step is the last step. The operations S120 through S150 may be repeatedly performed until the last step is completed. Survival paths may be determined when completing the last step. The start states may be updated to the first and second storages 170 and 180 alternately until the survival paths are determined.

In the operation S160, a trace back is performed based on the start states stored in a storage selected from the first and second storages 170 and 180. The convolutional decoder 100 may select and trace back a survival path when a last state of the survival path is equal to a corresponding start state. The convolutional decoder 100 may skip the trace back for the survival path if the last state of the survival path is different from the corresponding start state.

Figure 9:
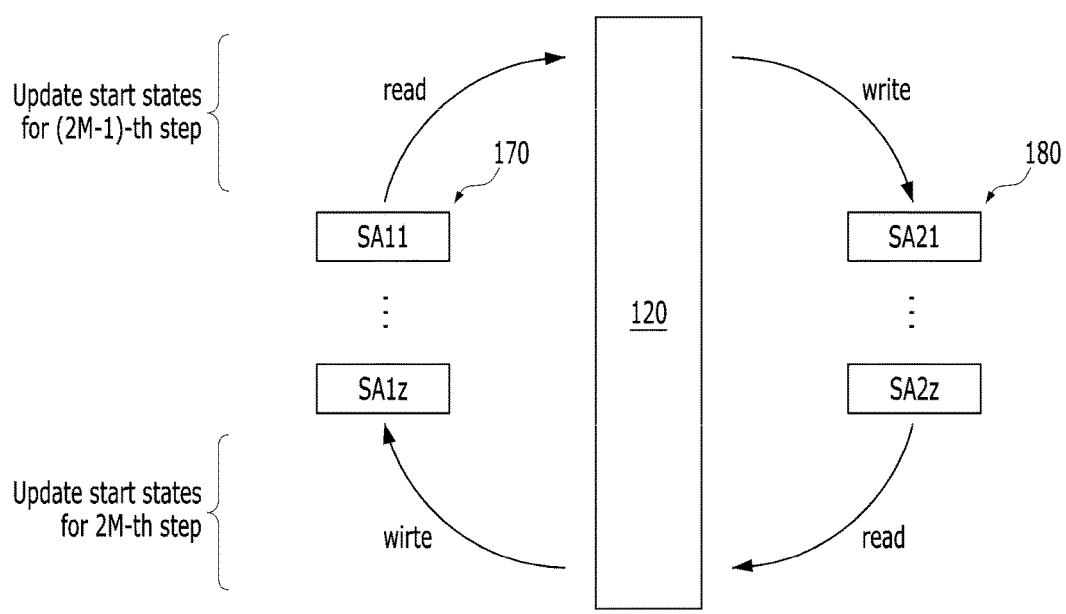
FIG. 9 illustrates an example of updating start states associated with states at each step.

FIG. 9 illustrates an example of updating start states associated with states of each step.

Referring to FIG. 9, the ACS processor 120 updates start states associated with states of a (2M−1)-th step from storage areas SA11 through SA1z of a first storage 170 to storage areas SA21 through SA2z of a second storage 180, where M is a positive integer.

The storage areas SA11 through SA1z of the first storage 170 may store the start states associated with z states of a previous step. The ACS processor 120 may read the start states from the storage areas SA11 through SA1z of the first storage 170 according to the states of the previous step which are transited to states of a current step, i.e., the (2M−1)-th step. The read start states may be written to the storage areas SA21 through SA2z of the second storage 180 as start states respectively corresponding to the states of the current step. A state before the transition may correspond to address of a storage area to be accessed in the read operation, a state after the transition may correspond to address of a storage area to be accessed in the write operation. It is assumed that a path representing a transition from an x-th state of the previous step to a y-th state of the current step is selected, where x is a positive integer less than or equal to z and y is a positive integer less than or equal to z. The ACS processor 120 may read a start state from an x-th storage area SA1x of the first storage 170 and write the read start state to a y-th storage area SA2y of the second storage 180.

The ACS processor 120 updates start states associated with states of a (2M)-th step from the storage areas SA21 through SA2z of the second storage 180 to the storage areas SA11 through SA1z of the first storage 170.

The storage areas SA21 through SA2z of the second storage 180 may store the start states associated with z states of a previous step, i.e., the (2M−1)-th step. The ACS processor 120 may read the start states from the storage areas SA21 through SA2z of the second storage 180 according to the states of the previous step which are transited to states of a current step, i.e., the (2M)-th step. The read start states may be written to the storage areas SA11 through SA1z of the first storage 170 as start states respectively corresponding to the states of the current step. It is assumed that a path representing a transition from an x-th state of the previous step to a y-th state of the current step is selected. The ACS processor 120 may read a start state from an x-th storage area SA2x of the second storage 180 and write the read start state to a y-th storage area SA1y of the first storage 170.

Figure 10:
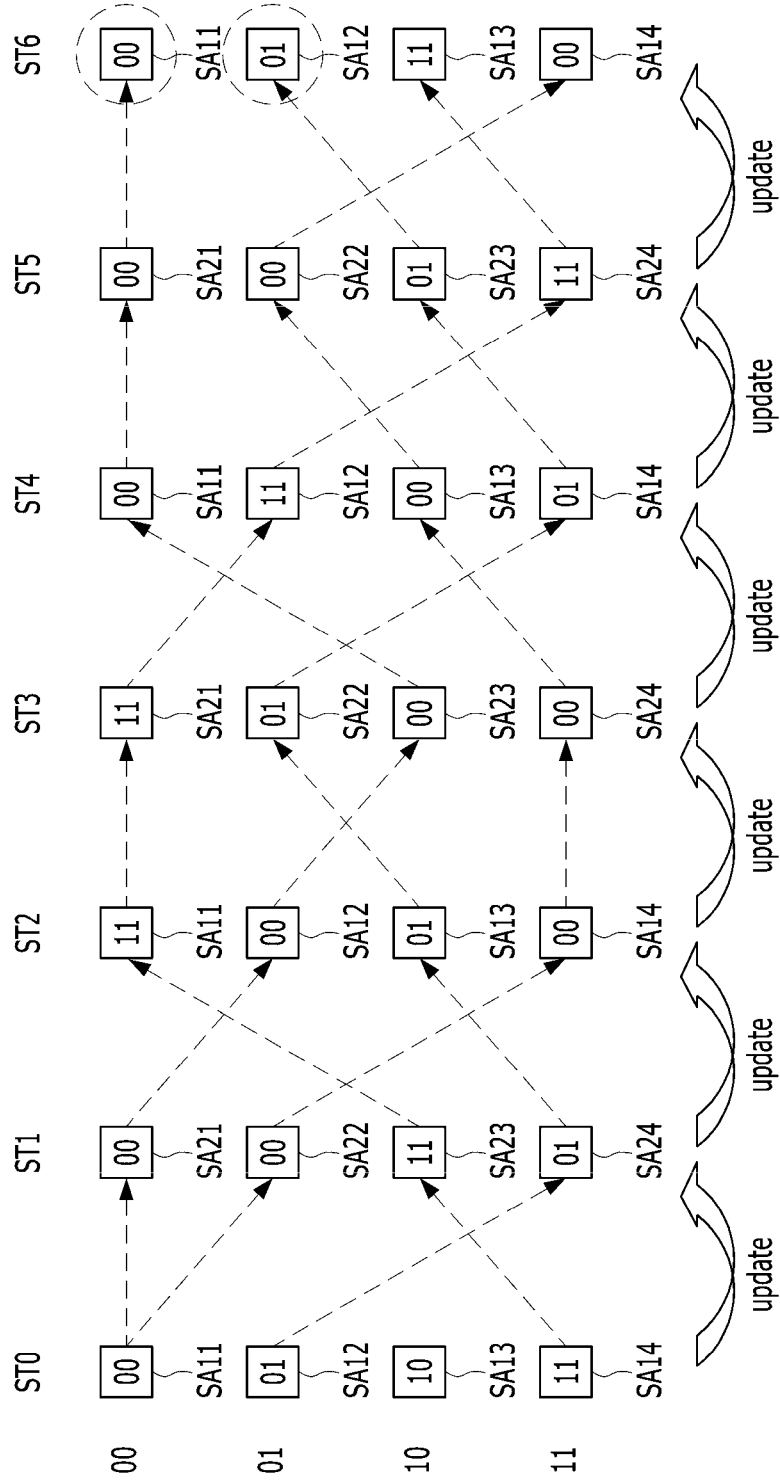
FIG. 10 illustrates an example of updating the first and second storages according to the exemplary embodiment of FIG. 9 when the survival paths of FIG. 4 are selected.

FIG. 10 illustrates an example of updating the first and second storages according to the exemplary embodiment of FIG. 9 when the survival paths of FIG. 4 are selected.

Addresses indicating the first through fourth storage areas SA11 through SA14 of the first storage 170 correspond to the first through fourth states 00, 01, 10, and 11, respectively. Similarly, addresses indicating the first through fourth storage areas SA21 through SA24 of the second storage 180 correspond to the first through fourth states 00, 01, 10, and 11, respectively.

Referring to FIGS. 4 and 10, at the start step ST0, each of the first through fourth storage areas SA11 through SA14 of the first storage 170 stores a state, which corresponds to its address, as a start state. The first through fourth storage areas SA11 through SA14 of the first storage 170 store start states 00, 01, 10, and 11, respectively.

At the first step ST1 in trellis representation, each of the first state 00 and the second state 01 is transited from the first state 00 of the start step ST0, the third state 10 is transited from the fourth state 11 of the start step ST0, and the fourth state 11 is transited from the second state 01 of the start step ST0.

The second storage 180 is updated from the first storage 170 according to each transition of the first step ST1. A state before a transition may correspond to a read address indicating one of the storage areas SA11 through SA14 of the first storage 170, a state after the transition may correspond to a write address indicating one of the storage areas SA21 through SA24 of the second storage 180. The start state 00 is read from the first storage area SA11 of the first storage 170, and written to the first and second storage areas SA21 and SA22 of the second storage 180. The start state 11 is read from the fourth storage area SA14 of the first storage 170, and the read start state 11 is written to the third storage area SA23 of the second storage 180. The start state 01 is read from the second storage area SA12 of the first storage 170, and the read start state 01 is written to the fourth storage area SA24 of the second storage 180.

At the second step ST2 in the trellis representation, the first state 00 is transited from the third state 10 of the first step ST1, the second state 01 is transited from the first state 00 of the first step ST1, the third state 10 is transited from the fourth state 11 of the first step ST1, and the fourth state 11 is transited from the second state 01 of the first step ST1.

The first storage 170 is updated from the second storage 180 according to each transition of the second step ST2. A state before a transition may correspond to a read address indicating one of the storage areas SA21 through SA24 of the second storage 180, a state after the transition may correspond to a write address indicating one of the storage areas SA11 through SA14 of the first storage 170. The start state 11 is read from the third storage area SA23 of the second storage 180, the read start state 11 is written to the first storage area SA11 of the first storage 170. The start state 00 is read from the first storage area SA21 of the second storage 180, the read start state 00 is written to the second storage area SA12 of the first storage 170. The start state 01 is read from the fourth storage area SA24 of the second storage 180, the read start state 01 is written to the third storage area SA13 of the first storage 170. The start state 00 is read from the second storage area SA22 of the second storage 180, and the read start state 00 is updated to the fourth storage area SA14 of the first storage 170.

In this manner, the first and second storages 170 and 180 is alternately updated at the third through sixth steps ST3 through ST6.

At the third step ST3, the first through fourth storage areas SA21 through SA24 of the second storage 180 are updated as start states 11, 01, 00, and 00, respectively. At the fourth step ST4, the first through fourth storage areas SA11 through SA14 of the first storage 170 are updated as start states 00, 11, 00, and 01, respectively. At the fifth step ST5, the first through fourth storage areas SA21 through SA24 of the second storage 180 are updated as start states 00, 00, 01, and 11, respectively. At the last step ST6, the first through fourth storage areas SA11 through SA14 of the first storage 170 are updated as start states 00, 01, 11, and 00, respectively.

The trace back logic 150 shown in FIG. 2 may select at least one of first through fourth survival paths SVP1 through SVP4 based on data stored in the first storage 170. The first storage area SA11 of the first storage 170 stores the start state 00. The first state 00 corresponding to the first storage area SA11 of the first storage 170 is equal to the start state 00 that remains therein. The second state 01 corresponding to the second storage area SA12 of the first storage 170 is equal to the start state 01 that remains therein. Accordingly, the first survival path SVP1 having the first state 00 of the last step ST6 and the second survival path SVP2 having the second state 01 of the last step ST6 may be selected. The third survival path SVP3 and the fourth survival path SVP4 may not be selected because their last states are not equal to their start states, respectively. A trace back may be performed for each of the first and second survival paths SVP1 and SVP2.

Figure 11:
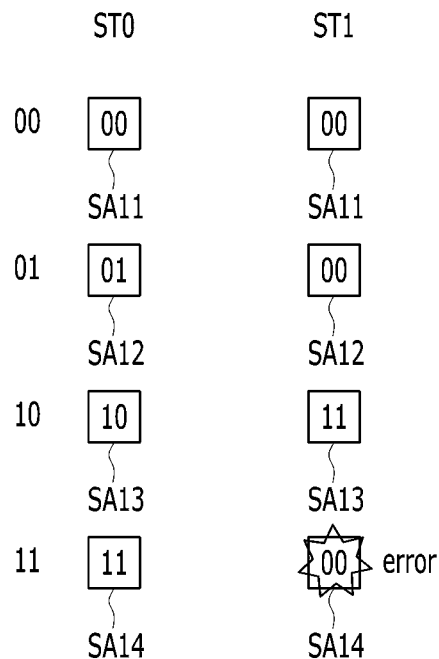
FIG. 11 illustrates an example of updating start states using a single storage.

FIG. 11 illustrates an example of updating start states using a single storage. For descriptive convenience, the storage is assumed as the first storage 170.

Referring to FIG. 11, at a start step ST0, the first through fourth storage areas SA11 through SA14 of the first storage 170 store start states 00, 01, 10, and 11, respectively.

At a first step ST1, as described with reference to FIG. 4, each of the first state 00 and the second state 01 is transited from the first state 00 of the start step ST0, the third state 10 is transited from the fourth state 11 of the start step ST0, and the fourth state 11 is transited from the second state 01 of the start step ST0.

The first storage area SA11 is updated to store a start state of the first storage area SA11. The start state 00 may remain in the first storage area SA11. The second storage area SA12 is updated to store the start state 00 of the first storage area SA11. The third storage area SA13 is updated to store the start state 11 of the fourth storage area SA14.

The fourth storage area SA14 may be updated to store a start state of the second storage area SA12. Since the second storage area SA12 have already been updated, a start state associated with a state before a transition may not remain in the second storage area SA12 any longer. If the start state 00 stored in the second storage area SA12 is updated to the fourth storage area SA14, the data updated to the fourth storage area SA14 may be erroneous data because it does not store the correct state 01.

If the ACS processor 120 simultaneously reads the start states from the first through fourth storage areas SA11 through SA14 to update thereto, the data updated to the fourth storage area SA14 may not store the erroneous data. However, if a large number of states exists in trellis representation and a number of storage areas SA11 through SA1$z$ shown in FIG. 6 increases, the storage areas SA11 through SA1$z$ may be divided into a plurality of groups and the ACS processor 120 may update the groups sequentially, because the ACS processor 120 has a limited input and output bandwidth. In this case, a group updated later may store erroneous data as described above.

According to an exemplary embodiment shown in e.g., FIG. 10, start states are updated to the first and second storages 170 and 180 alternately whenever paths are selected at each step. Accordingly, the start states, that remain in one of the first and second storages 170 and 180 after survival paths are determined, may have high reliability without causing the erroneous store operation illustrated with respect to FIG. 11.

Figure 12:
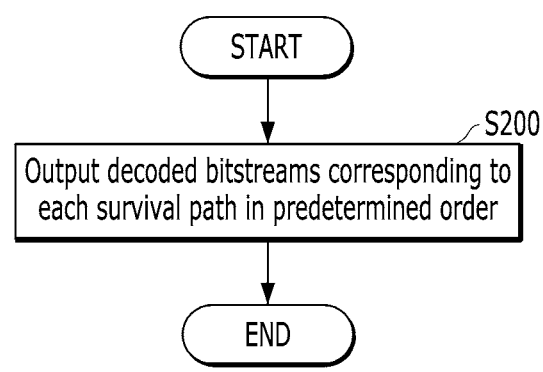
FIG. 12 is a flowchart illustrating a method of outputting decoded bit streams according to an exemplary embodiment.

FIG. 12 is a flowchart illustrating a method of outputting decoded bit streams DBS according to an exemplary embodiment.

Referring to FIGS. 2 and 12, in operation S200, the convolutional decoder 410 outputs decoded bit streams DBS in a predetermined order, the decoded bit streams DBS corresponding to each of selected survival paths.

It is understood that a survival path having a maximum likelihood value (e.g., a low path metric) may have high reliability. However, operations for reading path metrics of selected survival paths from the path metric memory 130, comparing the read path metrics, and determining a survival path having a maximum likelihood path metric to output the same require additional resources and time.

Meanwhile, as described with reference to FIG. 2, each of the selected survival paths has a last state same as a start state. It means that the selected survival path has high reliability in a data decoding of tail biting convolutional code (TBCC)-encoded data. According to an exemplary embodiment, the decoded bit streams DBS corresponding to each of the selected survival paths may be outputted in the predetermined order without determining a survival path having a maximum likelihood path metric among the selected survival paths. Accordingly, the trace back logic 150 may output the decoded bit streams DBS with higher speed.

In an exemplary embodiment, a selected survival path having a greater last state may be traced back later than a selected survival path having a lesser last state. For example, when first and second survival paths SVP1 and SVP2 are selected as described with reference to FIG. 4, the trace back logic 150 may output the decoded bit streams DBS according to the first survival path SVP1 in which the last state is the first state 00, and then output the decoded bit streams DBS according to a second survival path SVP2 in which the last state is the second state 01.

In an exemplary embodiment, a selected survival path having a lesser last state may be traced back later than a selected survival path having a greater last state. Exemplary embodiments are not limited thereto. The sequence of outputting the decoded bit streams DBS corresponding to each of the selected survival paths may be determined according to various suitable manners.

Figure 13:
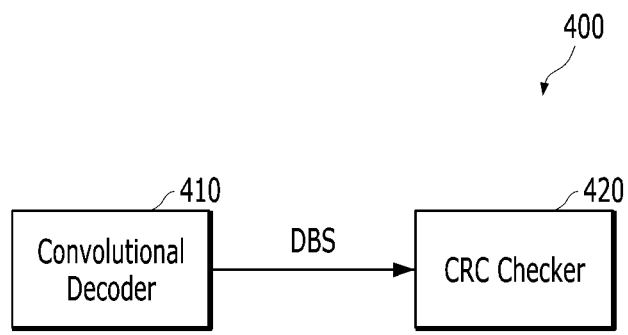
FIG. 13 is a block diagram illustrating a MODEM including a convolutional decoder.

FIG. 13 is a block diagram illustrating a MODEM including a convolutional decoder.

The MODEM 400 includes a convolutional decoder 410 and a CRC checker 420. The convolutional decoder 410 may be configured same as the convolutional decoder 100 described with reference to FIG. 2. Hereinafter, the same descriptions will be omitted for conciseness.

The CRC checker 420 receives decoded bit streams DBS from the convolutional decoder 410. The decoded bit streams DBS are acquired from a selected survival path in which a last state is equal to a start state, and provided to the CRC checker 420. The CRC checker 420 checks the validity of the decoded bit streams DBS using parity bits included in the decoded bit streams DBS.

The CRC checker 420 may drop the decoded bit streams DBS when the decoded bit streams DBS is invalid. The CRC checker 420 may output the decoded bit streams DBS when the decoded bit streams DBS is valid.

In an exemplary embodiment, the CRC checker 420 may further perform error correction for the decoded bit streams DBS on the basis of the parity bits.

Figure 14:
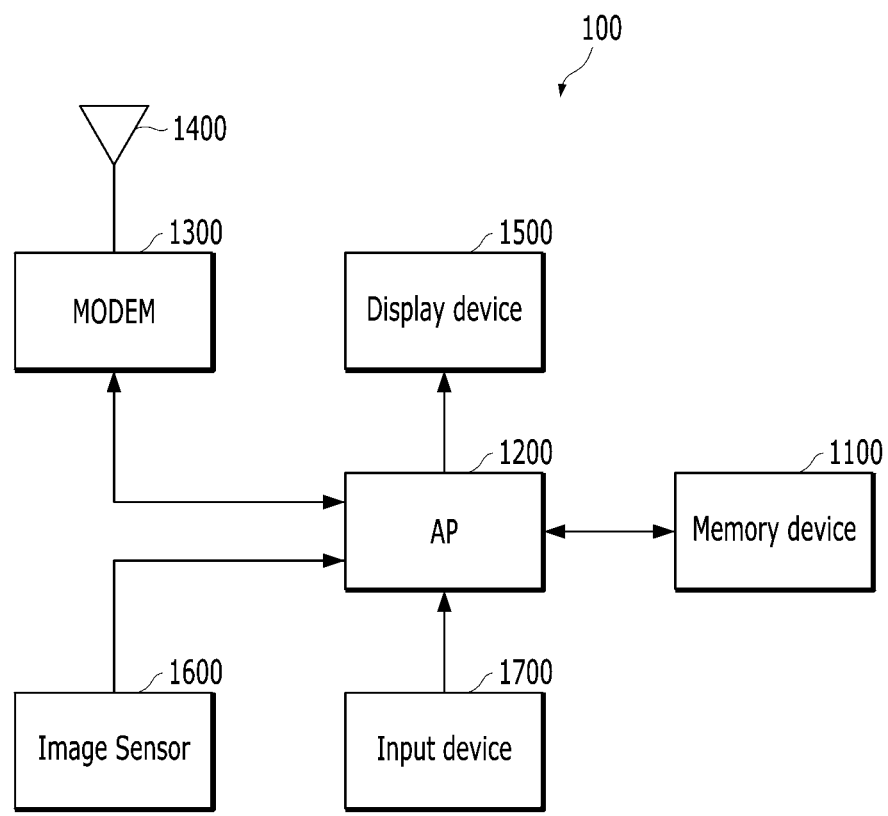
FIG. 14 is a block diagram illustrating a computing apparatus including a MODEM.

FIG. 14 is a block diagram illustrating a computing apparatus including a MODEM.

Referring to FIG. 14, the computing apparatus 1000 includes a memory device 1100, an application processor (AP) 1200, a MODEM 1300, an antenna 1400, a display device 1500, an image sensor 1600, and an input device 1700.

The application processor 1200 controls overall operations of the computing apparatus 1000. The application processor 1200 may include a memory controller for controlling the memory device 1100. The application processor 1200 may process data being provided from the MODEM 1300 and transfer the processed data to the display device 1500 and the MODEM 1300.

The MODEM 1300 may communicate a radio signal through the antenna 1400. The MODEM 1300 may convert the radio signal into data that is available to be processed by the application processor 1200. The MODEM 1300 may convert data provided from the application processor 1200 into the radio signal and output the radio signal through the antenna 1400 to an external apparatus. The MODEM 1300 may be configured as the MODEM 400 shown in FIG. 13. For instance, the MODEM 1300 may include LTE transceiver, HSDPA/WCDMA (High Speed Downlink Packet Access/Wideband Code Division Multiple Access) transceiver, GSM (Global System for Mobile Communications) transceiver, and the like.

The input device 1700 recognizes an input for controlling operations of the application processor 1200 and generates input data. For example, the input device 1700 may include a key pad, a mouse, a finger scan sensor, a dome switch, a touch pad, jog wheel, and the like.

The image sensor 1600 converts optical images into digital signals and transfer the digital signals to the application processor 1200. The digital signals may be displayed on the display device 1500 or stored in the memory device 1100.

The computing apparatus 1000 may be embodied as PC (Personal Computer), network server, tablet PC, netbook, smart phone, PDA (Personal Digital Assistant), PMP (Portable Multimedia Player), or the like.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An apparatus comprising:
a first storage comprising first storage areas;
a second storage comprising second storage areas;
a branch metric processor configured to determine branch metrics for transitions of states from a start step to a last step according to input bit streams;
an Add-Compare-Select (ACS) processor configured to:
select maximum likelihood path metrics to determine a survival path according to the branch metrics; and
read and write states of the start step from and to the first storage and the second storage alternately based on the selection of the maximum likelihood path metrics, a state of a first step being transited to a state of a second step corresponding to an address of a storage area to access for the read and the state of the second step corresponding to an address of a storage area to access for the write; and
a trace back logic to selectively trace back the survival path based on the states of the start step stored in a selected storage among the first storage and the second storage.

2. The apparatus of claim 1, wherein each of the first storage areas and the second storage areas is configured to store a state corresponding to its address as a state of the start step.

3. The apparatus of claim 1, wherein:
the trace back logic is configured to trace back the survival path to output decoded bit streams in response to a state of the last step on the survival path being identical to a corresponding state of the start step stored in the selected storage; and
the trace back logic is configured to skip the trace back for the survival path in response to the state of the last step on the survival path being different from the corresponding state of the start step stored in the selected storage.

4. The apparatus of claim 1, further comprising:
a storage interface coupled to the ACS processor, the first storage, and the second storage,
wherein the storage interface couples the ACS processor to one of the first storage and the second storage in response to a selection signal of the ACS processor.

5. The apparatus of claim 4, wherein:
the storage interface is further coupled to the trace back logic; and
the storage interface is configured to couple the trace back logic to the selected storage after determination of the survival path.

6. The apparatus of claim 5, wherein the storage interface comprises:

a demultiplexer comprising an input terminal coupled to the ACS processor and output terminals coupled to the first storage and the second storage;

a multiplexer comprising input terminals coupled to the first storage and the second storage; and a switch connecting an output terminal of the multiplexer to one of the ACS processor and the trace back logic.

7. The apparatus of claim 1, wherein:

the ACS processor is configured to determine a plurality of survival paths; and the trace back logic is configured to, in response to at least two survival paths being selected among the determined survival paths, trace back the selected survival paths in a predetermined order.

8. The apparatus of claim 7, wherein the predetermined order is arranged based on values of the states at the last step of the plurality of survival paths.

9. The apparatus of claim 1, further comprising:

a receiver configured to receive signals over at least one communication network, at least one of the signals corresponding to the input bit streams.

10. The apparatus of claim 1, wherein the second step is directly after the first step.

11. A convolutional decoder comprising:

a path metric memory configured to store first path metrics corresponding to states of a first step;

an Add-Compare-Select (ACS) processor configured to, based on first branch metrics and the first path metrics, select second path metrics corresponding to states of a second step;

a demultiplexer comprising an input terminal coupled to the ACS processor and output terminals coupled to a first storage and a second storage;

a multiplexer comprising input terminals coupled to the first storage and the second storage; and a switch configured to couple an output terminal of the multiplexer to the ACS processor in response to reception of a first selection signal, wherein the ACS processor is further configured to:

read, via the multiplexer, first states respectively corresponding to the states of the first step from the first storage; and write, via the demultiplexer, the read first states to the second storage in response to the second path metrics being selected.

12. The convolutional decoder of claim 11, wherein:

the first storage comprises first storage areas;

the second storage comprises second storage areas;

the first states respectively corresponding to the states of the first step are stored in the first storage areas; and the read first states are written to the second storage areas as first states respectively corresponding to the states of the second step.

13. The convolutional decoder of claim 12, wherein:

the ACS processor is configured to select third path metrics corresponding to states of a third step based on second branch metrics and the second path metrics; and the ACS processor is configured to write the first states stored in the second storage to the first storage in response to the third path metrics being selected.

14. The convolutional decoder of claim 11, further comprising:

a trace back logic to selectively trace back a survival path associated with the first path metrics and the second path metrics according to the first states stored in the second storage.

15. The convolutional decoder of claim 14, wherein, in response to reception of a second selection signal prior to the trace back, the switch is further configured to:

decouple the ACS processor from the output terminal of the multiplexer; and couple the output terminal of the multiplexer to the trace back logic.

16. The convolutional decoder of claim 14, wherein:

the trace back logic is configured to trace back the survival path to output decoded bit streams in response to a state of the second step on the survival path being identical to a corresponding first state stored in the second storage; and the trace back logic is configured to skip the trace back for the survival path in response to the state of the second step on the survival path being different from the corresponding first state stored in the second storage.

17. A method comprising:

receiving coded bit streams;

determining a survival path by selecting maximum likelihood path metrics for transitions of states from a start step to a last step based on the coded bit streams; and selecting whether to perform a trace back for the survival path, wherein determining the survival path comprises:

forming communication paths with a first storage and a second storage; and reading and writing states of the start step from and to the first storage and the second storage alternately based on the selection of the maximum likelihood path metrics, a state of a first step being transited to a state of a second step corresponding to an address of a storage area to access for the read and the state of the second step corresponding to an address of a storage area to access for the write.

18. The method of claim 17, wherein the selecting whether to perform the trace back for the survival path comprises skipping the trace back based on the states of the start step stored in a selected storage among the first storage and the second storage.

19. The method of claim 17, wherein:

the states are read from the first storage and the second storage via a multiplexer; and the states are written to the first storage and the second storage via a demulitplexer.

20. The method of claim 17, wherein, in response to performing the trace back, the method further comprises decoding the coded bit streams according to the survival path.

* * * * *